(12) United States Patent
Tanaka et al.

(10) Patent No.: US 7,851,260 B2
(45) Date of Patent: Dec. 14, 2010

(54) METHOD FOR MANUFACTURING A SEMICONDUCTOR DEVICE

(75) Inventors: Junji Tanaka, Tokyo (JP); Kouichi Meguro, Tokyo (JP); Yasuhiro Shinma, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 167 days.

(21) Appl. No.: 12/332,146

(22) Filed: Dec. 10, 2008

(65) Prior Publication Data

US 2009/0311831 A1    Dec. 17, 2009

(30) Foreign Application Priority Data

Dec. 10, 2007  (JP)  ............................. 2007-318745

(51) Int. Cl.
  *H01L 21/00*    (2006.01)
(52) U.S. Cl. ................ 438/108; 438/109; 438/113; 438/462; 438/465; 257/E21.503; 257/E21.514; 257/E23.021; 257/E23.121; 257/E29.022
(58) Field of Classification Search ......... 438/106–113, 438/458–465, 614; 257/E21.503–514, 23.021, 257/92, 121–124, 29.022
See application file for complete search history.

(56) References Cited

U.S. PATENT DOCUMENTS

| | | | |
|---|---|---|---|
| 5,300,459 A * | 4/1994 | Ushikubo et al. ........... 438/126 |
| 5,478,007 A * | 12/1995 | Marrs ..................... 228/180.22 |
| 5,550,408 A * | 8/1996 | Kunitomo et al. ........... 257/737 |
| 5,565,709 A * | 10/1996 | Fukushima et al. ......... 257/787 |
| 5,893,726 A * | 4/1999 | Farnworth et al. .......... 438/108 |
| 6,228,688 B1 * | 5/2001 | Ohta et al. ................... 438/127 |
| 6,355,131 B1 * | 3/2002 | Nakatani et al. ............. 156/252 |
| 6,717,245 B1 * | 4/2004 | Kinsman et al. ............. 257/678 |
| 6,762,511 B2 * | 7/2004 | Satsu et al. .................. 257/789 |
| 6,780,746 B2 * | 8/2004 | Kinsman et al. ............. 438/612 |
| 7,170,188 B2 * | 1/2007 | Matayabas et al. .......... 257/787 |
| 7,309,925 B2 * | 12/2007 | Matsumura et al. ......... 257/797 |
| 2002/0070446 A1 * | 6/2002 | Horiuchi et al. ............. 257/723 |

* cited by examiner

*Primary Examiner*—Michael S Lebentritt

(57) ABSTRACT

A method for manufacturing a semiconductor device is disclosed. As a part of the method, one surface of a substrate is molded with resin where the substrate and the resin are heated in a first heating process and maintained in a flat condition. The substrate and the resin are returned to room temperature while being maintained in the flat condition after the first heating process. The resin is cut after the substrate and the resin are returned to room temperature from a surface of the resin that is opposite the surface of the resin where the substrate contacts the resin. The substrate is left intact when the resin is cut. Thereafter, the substrate is separated.

20 Claims, 13 Drawing Sheets

METHOD FOR MANUFACTURING A SEMICONDUCTOR DEVICE

RELATED APPLICATIONS

This Application claims priority to Japanese Patent Application 2007-318745 entitled "Method for Manufacturing Semiconductor Device" filed Dec. 10, 2007 which is incorporated herein in its entirety.

TECHNICAL FIELD

The present invention relates to methods for manufacturing a semiconductor device.

BACKGROUND

In a conventional semiconductor device manufacturing process, after a semiconductor chip is mounted on a substrate, a molding process to mold the substrate and the semiconductor chip with resin is carried out for the protection of the semiconductor chip. After the molding process, in order to remove residual stress of the resin, a curing process is performed in order to reheat the resin and return it to room temperature. Japanese Patent Application Publication No. JP-A-4-313245 discloses a method for manufacturing a semiconductor device that includes curing the semiconductor device, after it is molded with resin, while applying a pressure to hold it flat.

In a single-side molded package that is typical for a ball grid array (BGA), only a surface of a substrate where a semiconductor chip is mounted thereon is molded with resin. Accordingly, the semiconductor device has a double layered structure that includes the substrate and the resin. It should be appreciated that because of the difference in coefficient of thermal expansion between the substrate and the resin, during the heating processes associated with the aforementioned molding and curing operations, warpage in the semiconductor device occurs. When warpage is large, errors in delivery and by adsorption to jigs in a later process may result. As a result, yield rate is decreased and the cost of the semiconductor device is increased.

In a conventional method, in order to reduce warpage, slits are provided on a substrate, to divide the resin into smaller divisions. However, in this method, the use of the substrate and the resin is less efficient which results in a higher cost. Further, when a substrate is made larger in an attempt to improve the efficiency, warpage increases.

SUMMARY

A method for manufacturing a semiconductor device is disclosed. As a part of the method, one surface of a substrate is molded with resin where the substrate and the resin are heated in a first heating process and are maintained in a flat condition. The substrate and the resin are returned to room temperature while being maintained in the flat condition after the first heating process. The resin is cut after the substrate and the resin are returned to room temperature from a surface of the resin that is opposite the surface of the resin where the substrate contacts the resin. The substrate is left intact when the resin is cut. Thereafter, the substrate is separated.

BRIEF DESCRIPTION OF THE DRAWINGS

The accompanying drawings, which are incorporated in and form a part of this specification, illustrate embodiments and, together with the description, serve to explain the principles of the embodiments.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1:
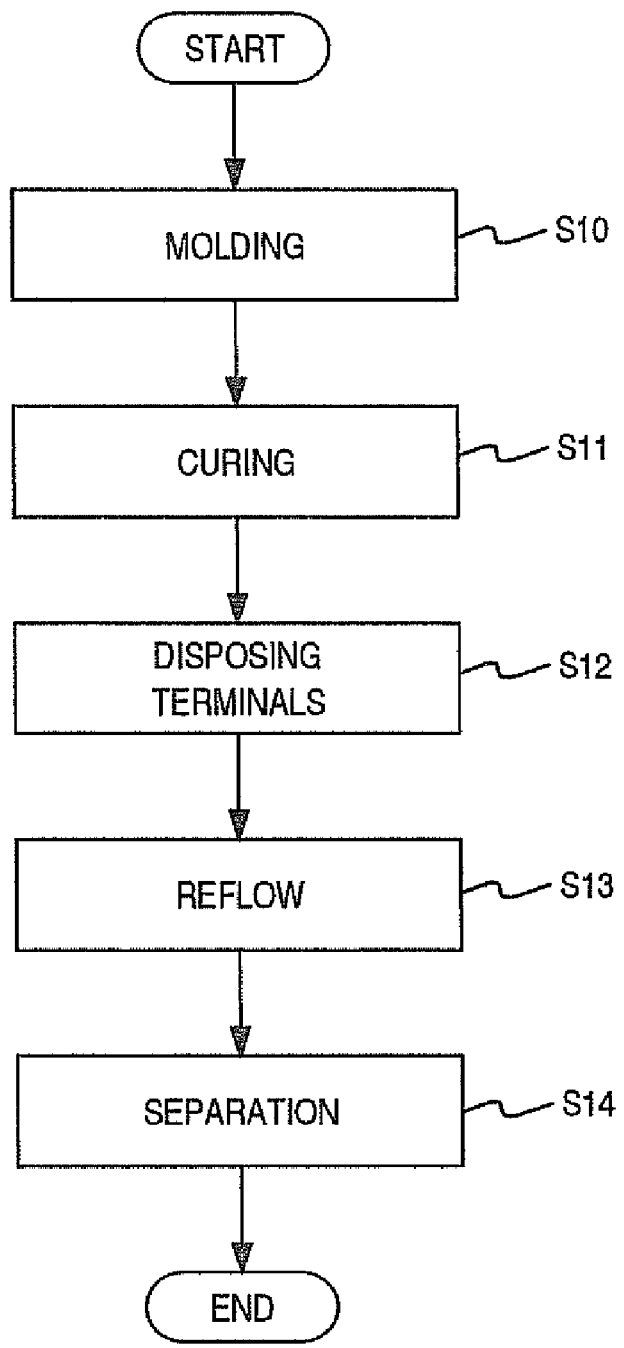
FIG. 1 is a flowchart showing steps in a manufacturing process of a semiconductor device of a first comparative example.
Figure 2:
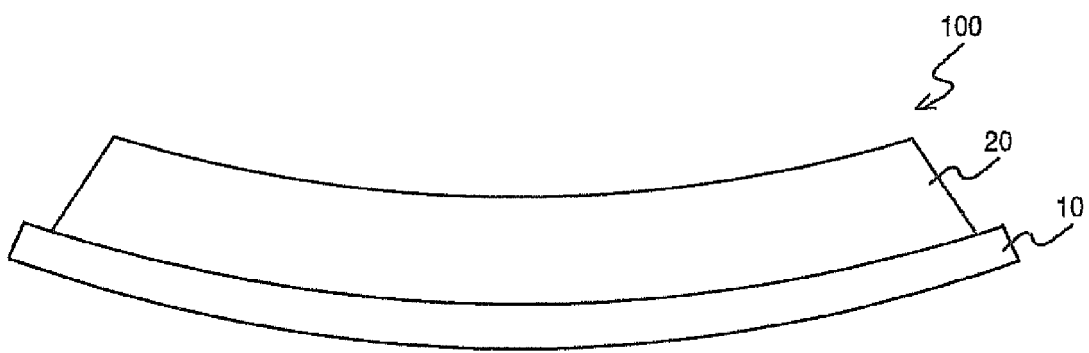
FIG. 2 is a side view illustrating a semiconductor device having warpage.

With reference to drawings, the problems to be solved by the present invention will be described. A first comparative example is an example of molding one surface of a substrate with resin and carrying out an ordinary curing process. With reference to FIGS. 1 and 2, a method for manufacturing a semiconductor device of the first comparative example will be described. FIG. 1 is a flowchart that shows a process flow involved in forming a semiconductor device of the first comparative example according to one embodiment. FIG. 2 is a side view illustrating a semiconductor device when warpage has occurred. In step S10, by molding a surface of an insulating substrate 10 composed of, for example glass epoxy, where a semiconductor chip (not shown) is mounted with a resin 20 having a thermosetting property composed of, for example epoxy, a semiconductor device 100 is formed. In one embodiment, the molding process includes heating the insulating substrate 10 and the resin 20 to, for example, 175 degrees Celsius (a third heating process). In the curing process in step S11, in order to remove residual stress of the molded resin 20, the insulating substrate 10 and the resin 20 are heated, for example, at 175 degrees Celsius for 5 hours (a first heating process) and, thereafter, are brought back to room temperature. In the aforementioned curing process, heating is carried out at a temperature equal to or higher than that used in the molding process.

In step S12, terminals 12 (not shown) composed of, for example, solder are disposed on the insulating substrate 10. In step S13, a reflow process is carried out to fix the terminals 12 onto the insulating substrate 10. The reflow process includes heating the insulating substrate 10, the resin 20, and the terminals 12 to, for example, 240degrees Celsius (a second heating process). In step S14, the insulating substrate 10 and the resin 20 are cut, for example, in 8 mm divisions, and are accordingly separated.

In a single-side molded package, the semiconductor device 100 has a double layered structure composed of the insulating substrate 10 and the resin 20. Because of the difference between the coefficient of thermal expansion of the insulating substrate 10 and that of the resin 20, when heated in the molding process in step S10, warpage such as is shown in FIG. 2 occurs. With the semiconductor device 100 exhibiting a large warpage, for example, in the terminal disposition process in step S12, errors related to delivery and adsorption to jigs may result.

Figure 3:
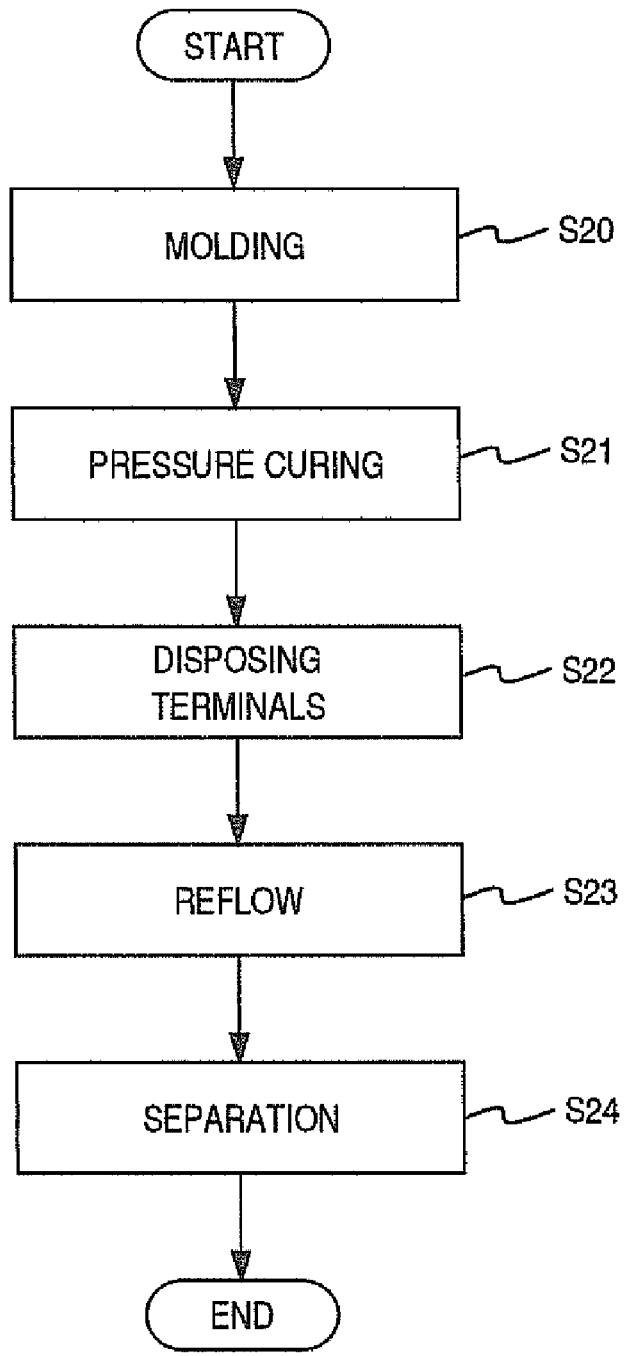
FIG. 3 is a flowchart showing steps in a manufacturing process of a semiconductor device of a second comparative example.
Figure 4A:
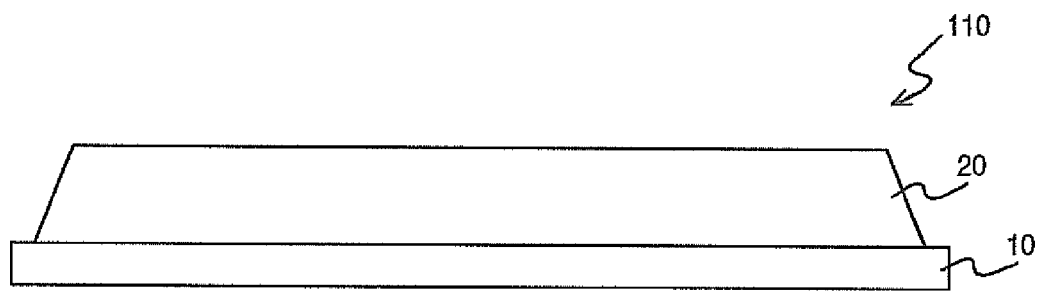
FIG. 4A is a side view illustrating a manufacturing process of a semiconductor device of the second comparative example.
Figure 4B:
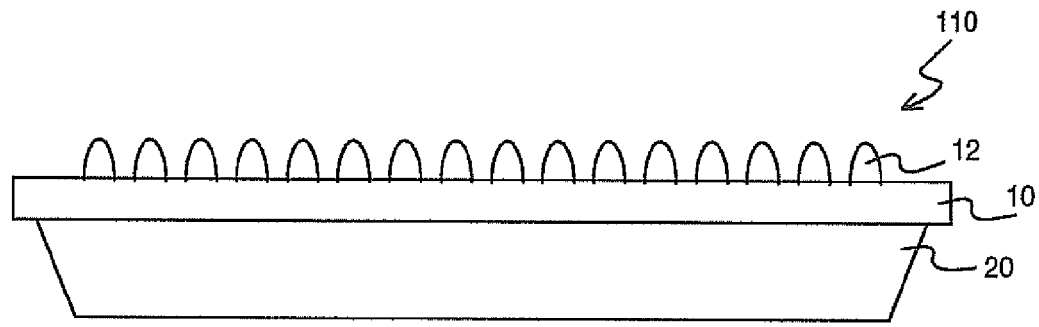
FIG. 4B is a side view illustrating a manufacturing process of a semiconductor device according to a second comparative example.
Figure 4C:
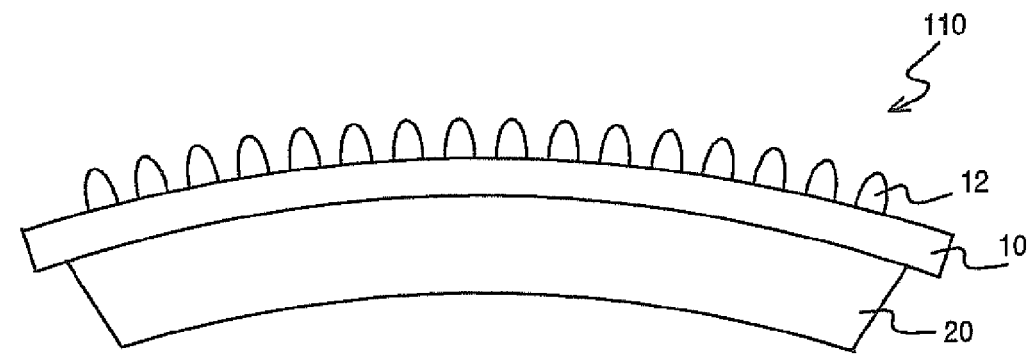
FIG. 4C is a side view illustrating the manufacturing process of the semiconductor device of the second comparative example.

In order to correct the warpage, after molding, by curing while applying a pressure to maintain the insulating substrate 10 and the resin 20 in a flat condition, a pressure curing process is carried out. As a second comparative example, an example performed using a pressure curing process will be described. With reference to FIGS. 3 to 4C, a method for manufacturing a semiconductor device of the second comparative example will be described. FIG. 3 is a flowchart that shows steps in a process for forming a semiconductor device according to a second comparative example. FIGS. 4A to 4C are side views illustrating respective operations corresponding to step S21 to step S23. It should be appreciated that the illustration of step S20 is the same as that shown in FIG. 2.

In step S20 shown in FIG. 3, a molding process is carried out to form a semiconductor device 110 (the semiconductor device 100 in the first comparative example is replaced with the semiconductor device 110 in the second comparative example). In step S21 as shown in FIG. 4A, a pressure curing process is carried out. In the pressure curing process, the insulating substrate 10 and the resin 20 are heated while a pressure is applied by putting a weight of, for example, 10 kg thereon to hold them in a flat condition. Thereafter, while being held flat, the insulating substrate 10 and the resin 20 are brought back to room temperature. In step S22 as shown in FIG. 4B, on the insulating substrate 10, the terminals 12 are disposed. In step S23 as shown in FIG. 4C, a reflow process is carried out to fix the terminals 12 onto the insulating substrate 10. In step S24, separation of the insulation substrate 10 and the resin 20 is carried out.

As shown in FIG. 4A, by performing the pressure curing process in step S21, the warpage that occurred in the molding process in step S20 is corrected. However, since the reflow process in step S23 is a process to heat, as shown in FIG. 4C, the warpage is restored. Therefore, with that of a large warpage, an error occurs in the separation process in step S24. As described above, in the reflow process in step S23, by heating at a temperature higher than those in the molding process in step S20 and in the pressure curing process in step S21, the warpage is restored.

Figure 5A:
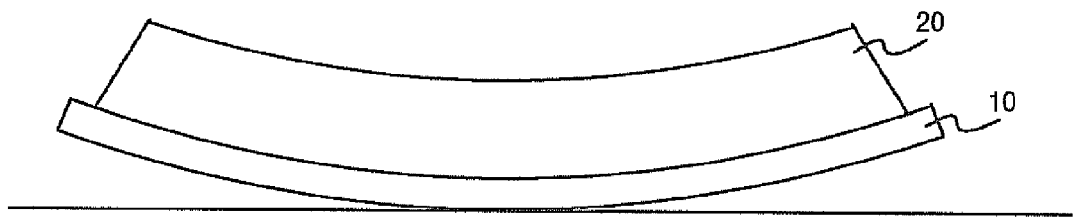
FIG. 5A is a side view illustrating a measuring method of warpage.
Figure 5B:
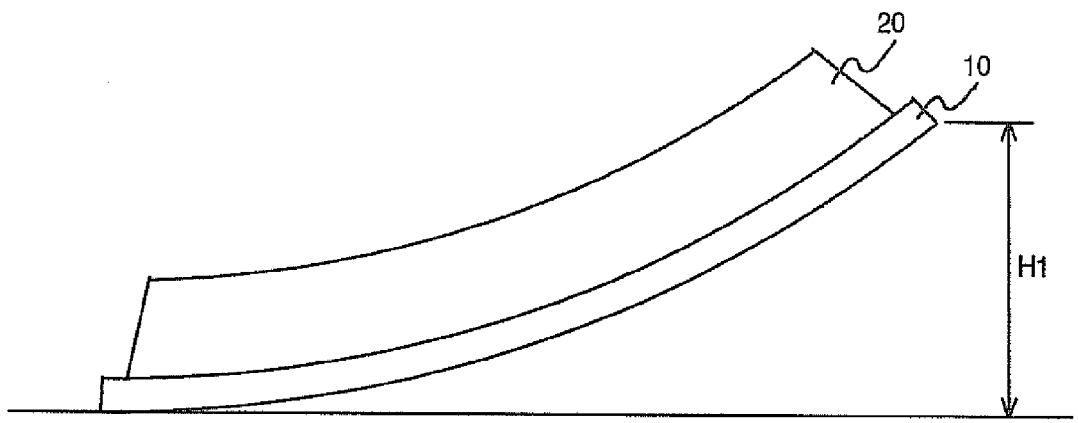
FIG. 5B is a side view illustrating a method of measuring warpage.
Figure 5C:
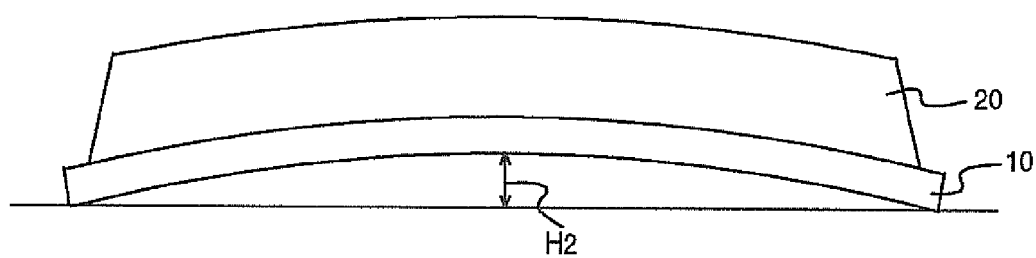
FIG. 5C is a side view illustrating a measuring method of warpage.

With reference to FIGS. 5A to 5C, a method of measuring warpage and definition of values for particular warpage features will be described. The measurement method and definitions described here apply to a later described first experiment, second experiment, and third experiment.

FIG. 5A is a side view illustrating, when a sample is placed on a plane surface with the insulating substrate 10 positioned face down, a type of warpage that occurs in a direction in which the center of the insulating substrate 10 is in contact with the plane surface and both ends thereof are separated from (extend above) the plane surface. As shown in FIG. 5B, the warpage in this case is defined (when one end of the bottom surface of the insulating substrate 10 is in contact with the plane surface as shown in FIG. 5B) by the height H1 that the other end extends from the plane surface, and is represented by a positive value.

FIG. 5C is a side view illustrating, when a sample is placed on the plane surface with the insulating substrate 10 face down, a type of warpage that occurs in a direction in which both ends of the insulating substrate 10 are in contact with the plane surface and the center thereof is separated from the plane surface. The warpage in this case is defined, when both ends of the bottom surface of the insulating substrate 10 are in contact with the plane surface, by the height H2 at the center of the insulating substrate 10 measured from the plane surface to the substrate, and is represented by a negative value.

Exemplary experiments related to the first and the second comparative examples will be described. The first experiment is a comparison among first, second and third samples, where a first sample uses an ordinary curing process that is performed without the application of any pressure, and a second and a third sample uses curing processes that are respectively carried out using the application of pressure.

Figure 6:
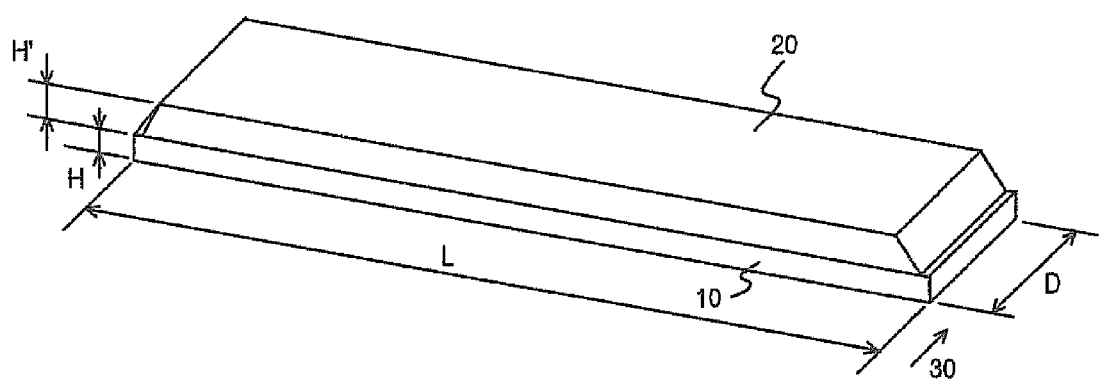
FIG. 6 is a perspective view illustrating a sample in a first experiment.

FIG. 6 is a perspective view of the first sample used in the first experiment. The dimensions of the insulating substrate 10 include a length L of 230 mm, a width D of 62 mm, and a thickness H of 180 μm. The resin 20 molds one surface of the insulating substrate 10 and has a thickness H' of 450 μm. The insulating substrate 10 is composed of glass epoxy, the resin 20 is composed of epoxy, and the terminals 12 (see FIGS. 9B-9D) are composed of solder. The second and the third samples have the same dimensions and materials as the first sample.

The content of the first exemplary experiment is described hereinafter. In a molding process, each of the samples was heated to 175 degrees Celsius and subsequently the warpage thereof measured. Thereafter, a curing process was carried out on the first sample without applying any pressure. On the second and the third samples, weights of 1.5 kg and 10 kg were respectively placed thereon and respective curing processes carried out. The curing processes were processes that involve applying heat at 175 degrees Celsius for 5 hours and returning the sample to room temperature. After the curing process, the warpage of each of the samples was measured. Each of the samples were heated to 240 degrees Celsius as a part of a reflow process and the warpage was measured.

Figure 7:
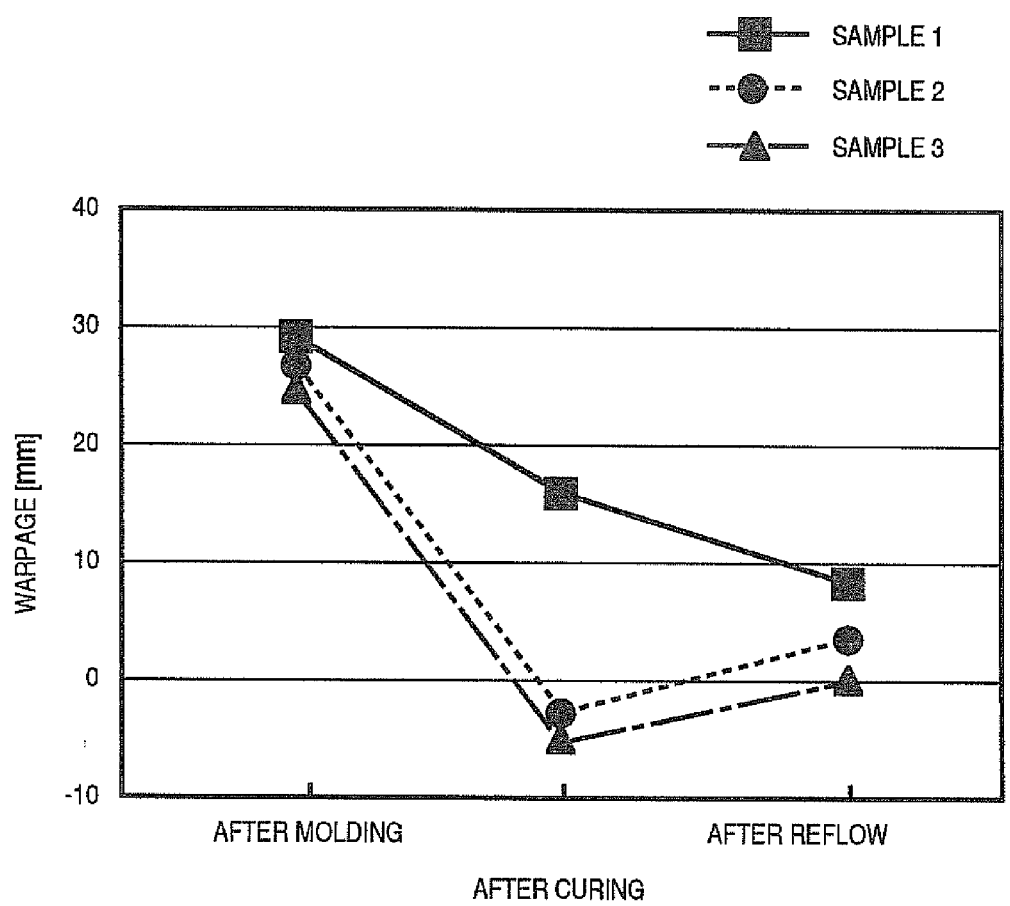
FIG. 7 is a graph showing results of the first experiment.

With reference to FIG. 7, the results of the first experiment are described herein below. FIG. 7 is a graph showing the respective warpage values of each of the samples after the molding, curing and reflow processes. After the molding process, the respective warpage of the first to the third samples were about 30 mm and similar in degrees. After the curing process, the warpage of the first sample on which the curing process has been carried out without the application of pressure was 15 mm. On the contrary, the respective warpage of the second and the third samples on which the pressure curing process have been carried out were about −3 mm. This shows that by performing a pressure curing process, warpage can be reduced. Subsequently, after performing the reflow process, the warpage of the first sample was about 8 mm. On the contrary, the warpage of the second and the third samples respectively were about 5 mm and about 0 mm, being increased from the warpage that is exhibited after the pressure curing process. From this result, it shows that, regardless of the weight applied during the curing process, the warpage which is temporarily corrected by the pressure curing process is restored by heating in the reflow process.

Figure 8:
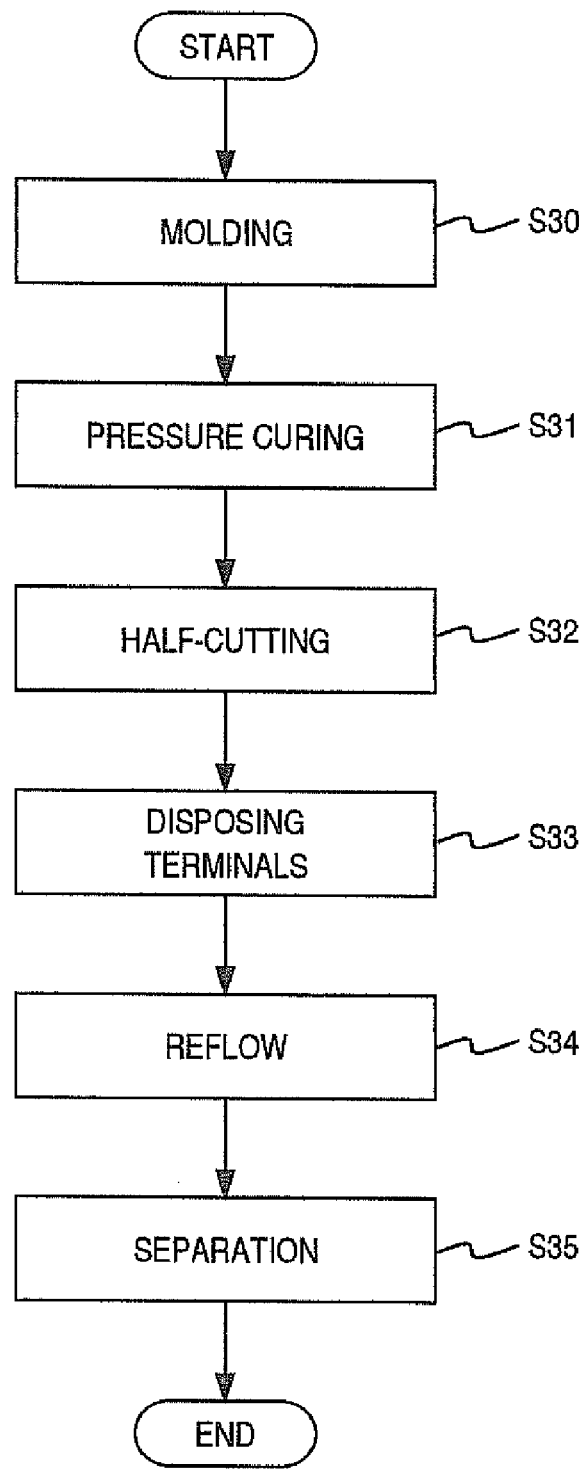
FIG. 8 is a flowchart that shows steps in a manufacturing process of a semiconductor device of a first embodiment of the present invention.

Now, with reference to drawings, embodiments of the present invention to solve the above mentioned problems will be described below. In a first embodiment of the present invention, an embodiment carried out using a pressure curing process and a half-cutting process will be schematically described. With reference to FIGS. 8 to 10, a method for manufacturing a semiconductor device of the first embodiment will be described. FIG. 8 shows a process flow of the semiconductor device of the first embodiment. FIGS. 9A to 9D are side views illustrating respective cross sections associated with step S32 to step S35. The illustrations of steps S30 and S31 are the same as those respectively shown in FIG. 2 and FIG. 4A. FIG. 10 is a top view illustrating a cutting plane line 22 associated with the half-cutting process and a cutting plane line 24 associated with a separation process. Referring to FIG. 10, a solid line represents the cutting plane line 22 and a broken line represents the cutting plane line 24.

In step S30 shown in FIG. 8, a molding process is performed to form a semiconductor device 120 (the semiconductor device 100 in the first comparative example is replaced with the semiconductor device 120 in the first embodiment). In step S31, a pressure curing process is performed. As shown in FIG. 4A, by carrying out the pressure curing process, the warpage of the semiconductor device 120 is corrected (the semiconductor device 110 in the second comparative example is replaced with the semiconductor device 120 in the first embodiment).

Figure 9A:
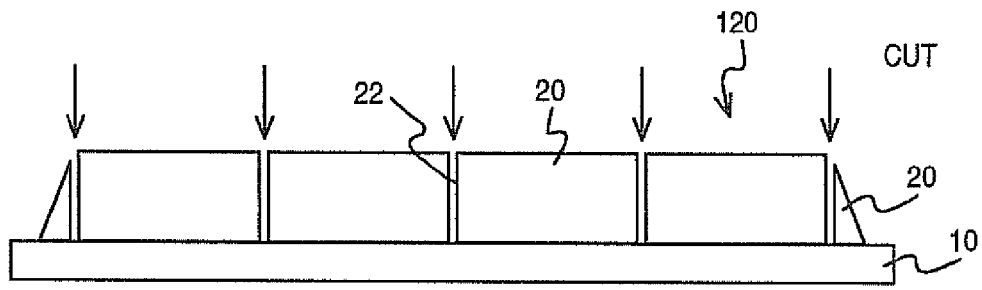
FIG. 9A is a side view illustrating the manufacturing process of the semiconductor device of the first embodiment.
Figure 10:
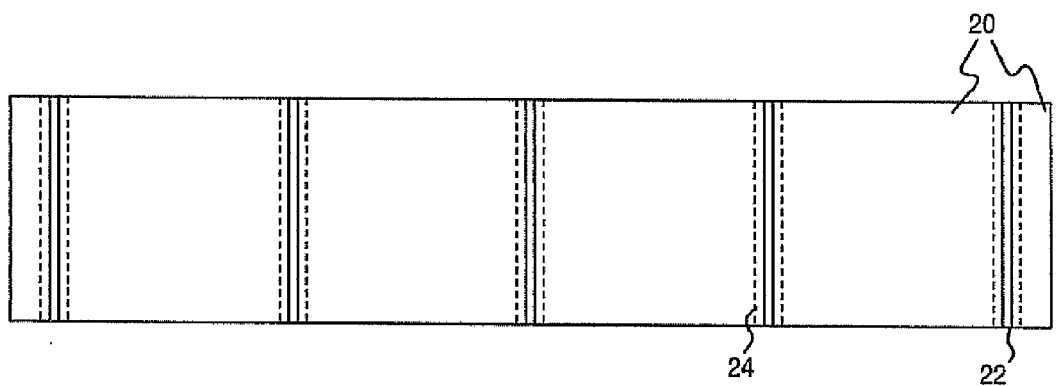
FIG. 10 is a top view showing a positional relationship between cutting plane lines.

In step S32 as shown in FIG. 9A, the half-cutting process that is executed to cut the resin 20 is performed. This process is a process, using a blade having a width of, for example 40 μm, to cut from a surface opposite the surface where the resin 20 contacts the insulating substrate 10, and along the cutting plane line 22, such that only the resin 20 is cut in a width direction so as to leave the insulating substrate 10 intact. In this exemplary embodiment, the width of the cutting plane line 22 may be 40 μm. In other embodiments other widths may be used.

Figure 9B:
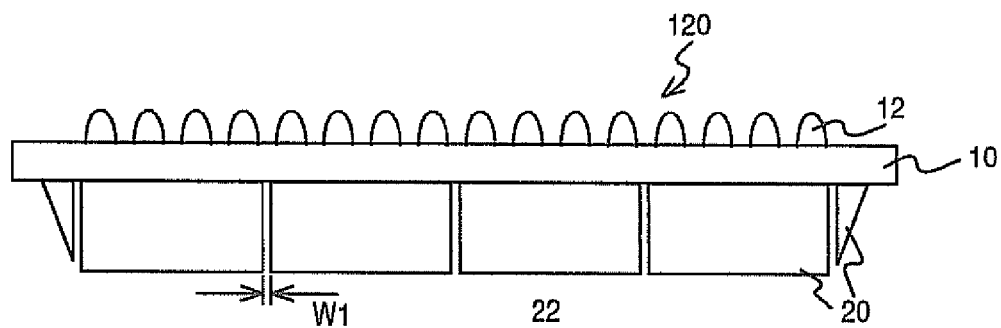
FIG. 9B is a side view illustrating the manufacturing process of the semiconductor device of the first embodiment.
Figure 9C:
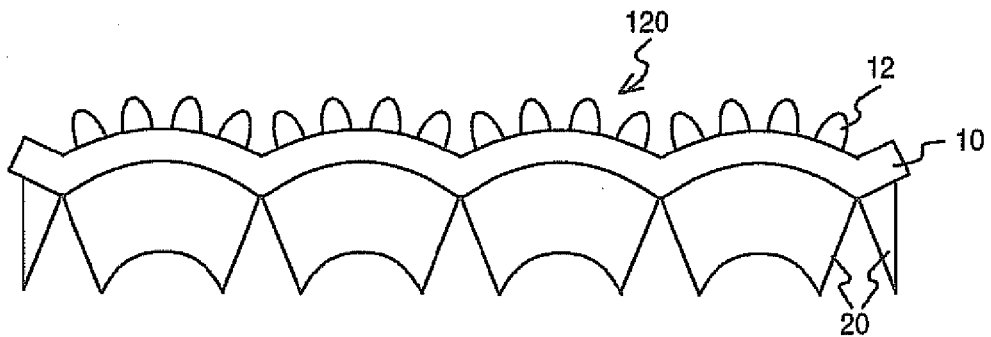
FIG. 9C is a side view illustrating the manufacturing process of the semiconductor device of the first embodiment.
Figure 9D:
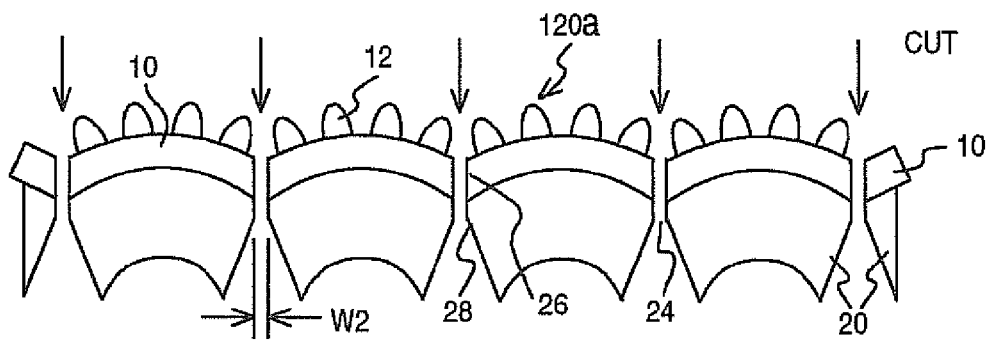
FIG. 9D is a side view illustrating the manufacturing process of the semiconductor device of the first embodiment.

In step S33 as shown in FIG. 9B, the terminals 12 are disposed on the insulating substrate 10. In step S34 as shown in FIG. 9C, a reflow process is carried out to form the terminals 12. In step S35 as shown in FIG. 9D, with a blade having a width of, for example 250 μm, the insulating substrate 10 and the resin 20 are cut along the cutting plane line 24, and in this manner the insulating substrate 10 is separated. In this exemplary embodiment, the width of the cutting plane line 22 may be 250 μm. In other embodiments other widths may be used. The aforementioned cutting operations separates semiconductor device 120a.

According to the first embodiment, when the pressure curing is performed in step S31, the warpage is temporarily corrected. Thereafter, in step S32, the half-cutting process is carried out to cut the resin 20 into small pieces. As shown in FIG. 9C, the warpage restored in the reflow process in step S34 occurs in each of the small pieces of the resin 20. Therefore, the warpage can be reduced from the warpage that occurs where and undivided insulating substrate 10 is processed as shown in the first and the second comparative examples. Accordingly, errors in delivery and by adsorption in the separation process in step S35 can be prevented. Consequently, the yield rate can be improved and cost reduction can be achieved.

As mentioned above, in one embodiment a method is provided to control warpage by providing slits in the insulating substrate 10 so as to divide the resin into small areas or divisions. According to the first embodiment, however, since the resin 20 is divided into small pieces in the half-cutting process in step S32, it is not necessary to provide slits to the insulating substrate 10. Further, the insulating substrate 10 can be made larger. Therefore, the efficiency in the use of the insulating substrate 10 and the resin 20 is improved. Consequently, cost reduction can be achieved.

The position of the cutting plane line 22 in the half-cutting process in step S32 and the position of the cutting plane line 24 in the separation process in step S35 are not limited as such. However, as shown in FIG. 10, in order not to affect the number of separated semiconductor devices 120a obtainable from the semiconductor device 120 in the half-cutting process, it is preferable that a plurality of cutting plane lines 22 in the half-cutting process overlaps with at least one of a plurality of cutting plane lines 24 in the separation process.

The width of the cutting plane line 22 in the half-cutting process and that of the cutting plane line 24 in the separation process of the insulating substrate 10 are not limited as such. However, as shown in FIG. 9D, in order for a cutting plane 26 of the insulating substrate 10 and a cutting plane 28 of the resin 20 to be in the same plane after the separation process, it is preferable that the width W1 of the cutting plane line 22 in the half-cutting process is smaller than the width W2 of the cutting plane line 24 in the separation process. More specifically, it is preferable that the cutting plane line 24 in the separation process includes the cutting plane line 22 in the half-cutting process.

An experiment on the first embodiment is described herein below. A second experiment is an experiment performed with the pressure curing process and the half-cutting process. A fourth sample used in the second experiment is configured to possess the same dimensions and materials as the first to the third samples used in the first experiment. The process flow of the second experiment is the same as that shown in FIG. 8. FIGS. 11A to 11D are side views of the fourth sample viewed from a direction of an arrow 30 shown in FIG. 6, while FIG.

Figure 11A:
FIG. 11A is a side view illustrating a second experiment according to one embodiment.
Figure 11B:
FIG. 11B is a side view illustrating a second experiment according to one embodiment.
Figure 11C:
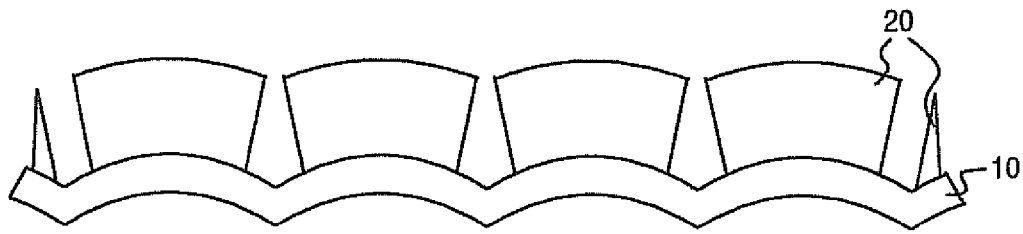
FIG. 11C is a side view illustrating a second experiment according to one embodiment.
Figure 11D:
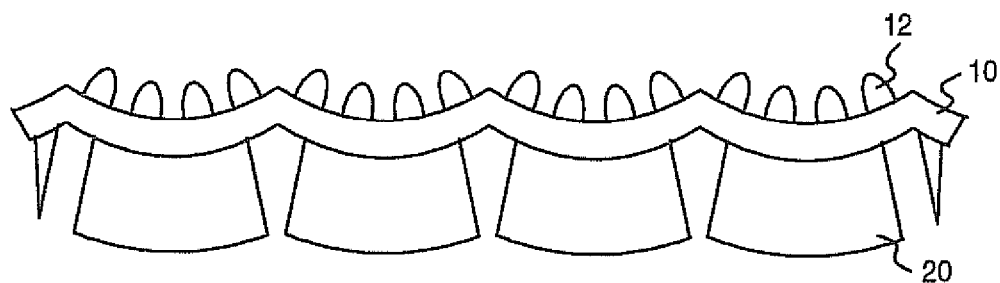
FIG. 11D is a side view illustrating a second experiment according to one embodiment.

11A illustrates step S30, FIG. 11B illustrates step S31, FIG. 11C illustrates step S32, and FIG. 11D illustrates step S34.

In step S30, the molding process may be performed by heating the insulating substrate 10 and the resin 20 to 175 degrees Celsius. In other embodiments other temperatures can be used. As shown in FIG. 11A, in the molding process, when the fourth sample was placed on a plane surface with the insulating substrate 10 face down, the warpage occurred in a direction in which the center of the insulating substrate 10 was in contact with the plane surface and both ends thereof were separated from the plane surface. In this example, the warpage after the molding process was 27 mm. In other embodiments, other warpage values can be obtained.

In step S31 as shown in FIG. 11B, the pressure curing process is performed, with a weight placed on the fourth sample to hold it in a flat condition, by heating it at 175 degrees Celsius for 5 hours and then by return it back to room temperature while being maintained in a flat condition. In other embodiments other temperatures and times may be used. After the pressure curing process, when the fourth sample was placed on the plane surface with the insulating substrate 10 face down, the warpage occurred in a direction in which both ends of the insulating substrate 10 were in contact with the plane surface and the center thereof was separated from the plane surface. In one embodiment, the warpage after the pressure curing process was −4 mm.

In step S32 as shown in FIG. 11C, the half-cutting process to cut the resin 20 is performed. In one embodiment, the thickness of the blade used for cutting, more specifically, the width of the cutting plane line of the resin 20 was 100 μm. The resin 20 was cut in every 8 mm in a width direction. In other embodiments other widths may be used. After the half-cutting process, the warpage may hardly be recognizable.

In step S33, the terminals 12 composed of solder are disposed on the insulating substrate 10. In step S34 as shown in FIG. 11D, by heating the fourth sample to 240 degrees Celsius, the reflow process is performed. After the reflow process, similar to that after the half-cutting process, the warpage was hardly recognizable either.

According to the second experiment, by performing the pressure curing process in step S31, the warpage was reduced from 27 mm to −4 mm. Subsequent to the pressure curing process in step S31, by performing the half-cutting process in step S32, the warpage is nearly eliminated. After the reflow process in step S34, the warpage is hardly recognizable and not much changed from that of before the reflow process. More specifically, by performing the half-cutting process, the warpage was prevented from restoring.

A third experiment is a comparison between a fifth sample fabricated without the half-cutting process being performed and a sixth sample carried out using the half-cutting process. The samples used in the experiment were of the same dimensions and materials as the samples used in the first and the second experiments.

The content of the third experiment is described herein below. On the fifth and sixth samples after the respective molding processes, the pressure curing processes were carried out and afterwards the warpage were measured. Thereafter, on the fifth sample, without performing the half-cutting process, the reflow process was performed and then the warpage was measured. On the sixth sample, the half-cutting process may be carried out after the pressure curing process and the warpage has been measured. Thereafter, the reflow processes were carried out and the warpage were measured. Further, a plurality of sixth samples was used and the same experiment was conducted on each of the samples.

Figure 12:
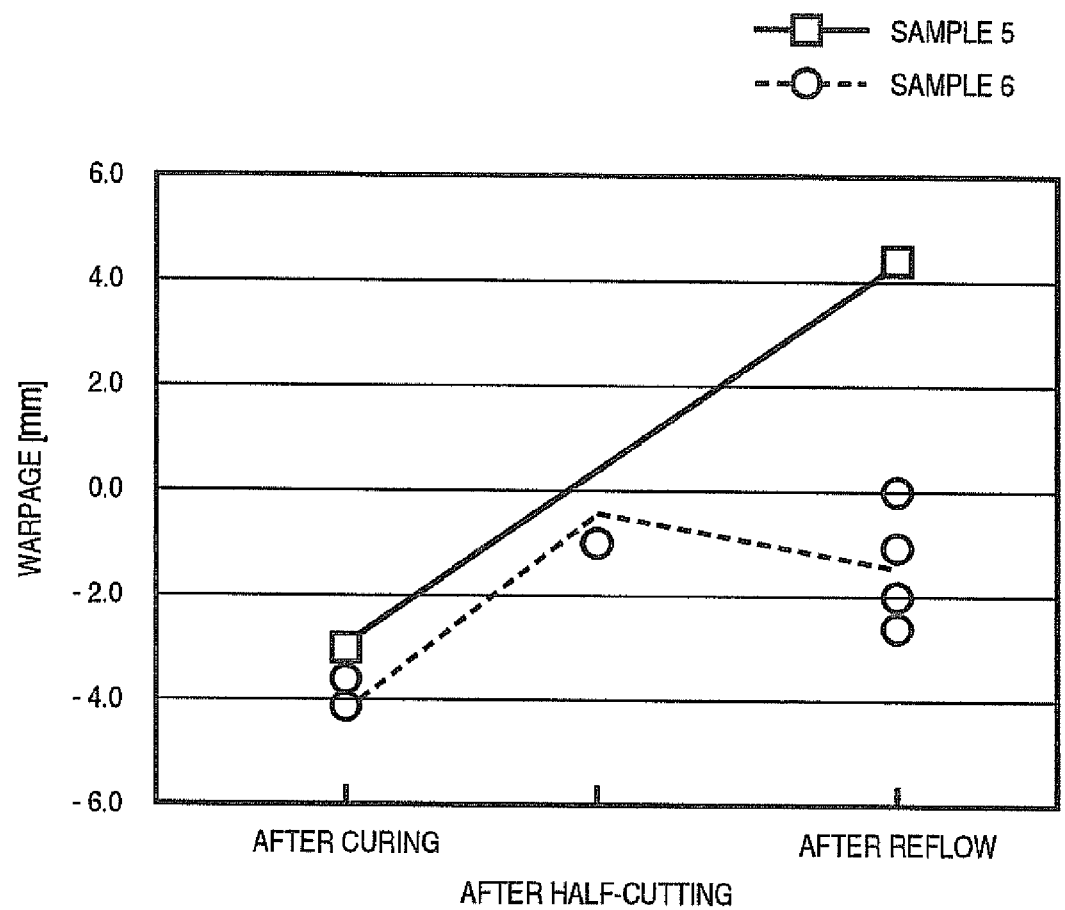
FIG. 12 is a graph showing results of a third experiment according to one embodiment.

With reference to FIG. 12, the results of the third experiment will be described. FIG. 12 is a graph showing the respective warpage values of the fifth sample after the curing process and the reflow process, and the respective warpage values of the sixth samples after the curing process, the half-cutting process, and the reflow process. After the curing process, the respective warpage of the fifth sample and sixth samples were about −4 mm and similar in degree. The warpage of the sixth samples after the half-cutting process were about 0 mm. This shows that, by performing the half-cutting process, the warpage of the sixth samples may be reduced.

The warpage of the fifth sample after the reflow process was 4 mm. This shows that, as similar to those second and third samples in the first experiment, the warpage corrected by the pressure curing process has been restored by the reflow process. On the contrary, the warpage of the sixth samples after the reflow process were from −2 mm to 0 mm. These values are similar in degree to the warpage after the half-cutting process. This result shows that, by carrying out the half-cutting process, the warpage in the reflow process was prevented from restoring.

Figure 13A:
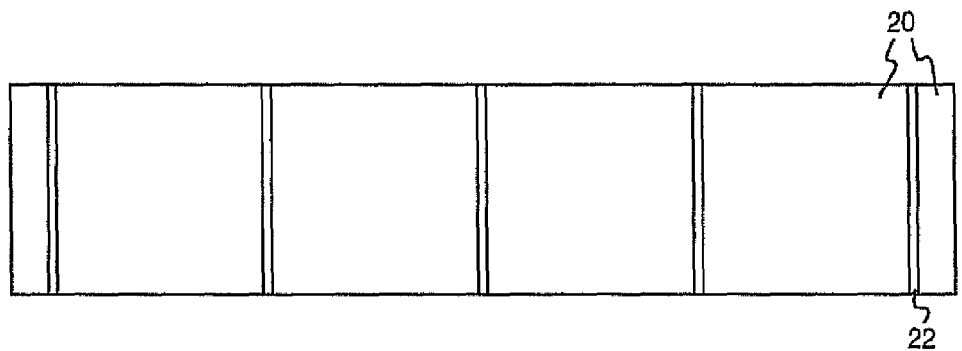
FIG. 13A is a top view of the semiconductor device according to one embodiment.

A second embodiment of the present invention is an embodiment of warpage that occurs in both longitudinal and width directions of an insulating substrate. As shown in FIG. 13A, in the first embodiment, since the insulating substrate 10 and the resin 20 are in a rectangular shape when viewed from top, the warpage occurred in a longitudinal direction. Therefore, the cutting plane line 22 in the half-cutting process was provided in a width direction.

Figure 13B:
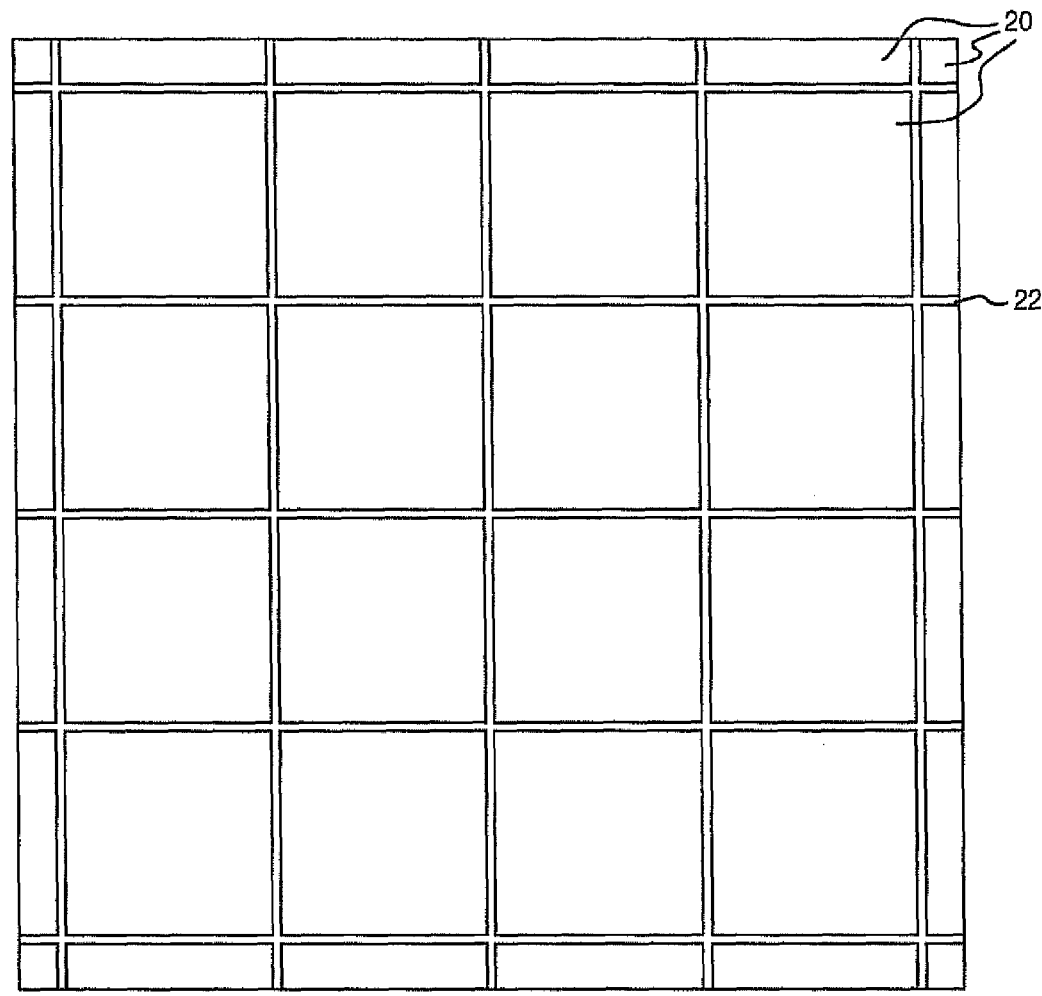
FIG. 13B is a top view of a semiconductor device according to another embodiment.

On the contrary, as shown in FIG. 13B, when the insulating substrate 10 is, for example, in a square shape, when viewed from the top, warpage occurs in both longitudinal and width directions. Therefore, the cutting plane line 22 is provided in a lattice shape and then the resin 20 is cut. Consequently, the warpage in both directions can be reduced. In the second embodiment, while the resin 20 is illustrated as possessing a square shape, whenever warpage occurs in longitudinal and width directions, even in other shapes, e.g. a rectangular shape, the warpage can be reduced by providing the cutting plane line 22 of the resin 20 in a lattice shape as described in the second embodiment.

With reference to exemplary embodiments, a method for manufacturing a semiconductor device is disclosed. As a part of the method, one surface of a substrate is molded with resin where the substrate and the resin are heated in a first heating process and are maintained in a flat condition. The substrate and the resin are returned to room temperature while being maintained in the flat condition after the first heating process. The resin is cut after the substrate and the resin are returned to room temperature from a surface of the resin that is opposite the surface of the resin where the substrate contacts the resin. The substrate is left intact when the resin is cut. Thereafter, the substrate is separated.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A method for manufacturing a semiconductor device, the method comprising:
   molding one surface of a substrate with resin;
   heating the substrate and the resin in a first heating process while maintaining the substrate and the resin in a flat condition;
   returning the substrate and the resin to room temperature while the substrate and the resin is being maintained in the flat condition after the first heating process;
   cutting the resin after returning the substrate and the resin to room temperature from a surface of the resin that is opposite the surface of the resin where the substrate contacts the resin wherein the substrate is left intact; and
   separating the substrate.

2. The method for manufacturing a semiconductor device according to claim 1, further comprising heating the substrate after cutting the resin and before separating the substrate in the second heating process.

3. The method for manufacturing a semiconductor device according to claim 1, wherein a plurality of cutting plane lines associated with cutting the resin overlaps with at least one of a plurality of cutting plane lines associated with separating the substrate.

4. The method for manufacturing a semiconductor device according to claim 1, wherein a cutting plane line associated with separating the substrate includes a cutting plane line associated with cutting the resin.

5. The method for manufacturing a semiconductor device according to claim 1, wherein the cutting the resin is in a width direction.

6. The method for manufacturing a semiconductor device according to claim 1, wherein the cutting the resin is in a lattice shape.

7. The method for manufacturing a semiconductor device according to claim 1, wherein the molding of the surface of the substrate with the resin includes heating the substrate and the resin in a third heating process.

8. The method for manufacturing a semiconductor device according to claim 2, wherein the second heating process is included in a process for providing terminals on the substrate.

9. A method for manufacturing a semiconductor device, the method comprising:
   forming a square shaped substrate;
   molding one surface of the square substrate with a square shaped resin layer;
   heating the square shaped substrate and the square shaped resin layer in a first heating process while maintaining the square shaped substrate and the square shaped resin layer in a flat condition;
   returning the square shaped substrate and the square shaped resin layer to room temperature while the square shaped substrate and the square shaped resin layer is being maintained in the flat condition after the first heating process;
   cutting the square shaped resin layer in a lattice pattern after returning the square shaped substrate and the square shaped resin layer to room temperature from a surface of the square shaped resin layer that is opposite a surface of the square shaped resin layer wherein the square shaped resin layer contacts the square shaped substrate;
   separating the square shaped substrate; and
   heating the square shaped substrate after the cutting of the square shaped resin and before the separating of the square shaped substrate in a second heating process.

10. The method for manufacturing a semiconductor device according to claim 9, wherein a plurality of cutting plane lines associated with cutting the resin overlaps with at least one of a plurality of cutting plane lines associated with separating the substrate.

11. The method for manufacturing a semiconductor device according to claim 9, wherein a cutting plane line associated with separating the substrate includes a cutting plane line associated with cutting the resin.

12. The method for manufacturing a semiconductor device according to claim 9, wherein the cutting the resin is in a width and a length direction.

13. The method for manufacturing a semiconductor device according to claim 9, wherein the cutting the resin is in a lattice shape that leaves the substrate intact.

14. The method for manufacturing a semiconductor device according to claim 9, wherein the molding of the surface of the substrate with the resin includes heating the substrate and the resin in a third heating process.

15. The method for manufacturing a semiconductor device according to claim 9, wherein the second heating process is included in a process for providing terminals on the substrate.

16. A method for manufacturing a semiconductor device package, the method comprising:
   forming a substrate;
   performing die bonding on the substrate;
   performing wire bonding of the die on the substrate;
   molding a surface of the substrate with resin;
   heating the substrate and the resin in a first heating process while maintaining the substrate and the resin in a flat condition;
   returning the substrate and the resin to room temperature while the substrate and the resin is being maintained in the flat condition after the first heating process;
   cutting the resin after returning the substrate and the resin to room temperature from a surface of the resin that is opposite the surface of the resin where the substrate contacts the resin wherein the substrate is left intact; and
   separating the substrate.

17. The method for manufacturing a semiconductor device package according to claim 16, wherein a plurality of cutting plane lines associated with cutting the resin overlaps with at least one of a plurality of cutting plane lines associated with separating the substrate.

18. The method for manufacturing a semiconductor device package according to claim 16, wherein a cutting plane line associated with separating the substrate includes a cutting plane line associated with cutting the resin.

19. The method for manufacturing a semiconductor device package according to claim 16, wherein the cutting the resin is in a width direction.

20. The method for manufacturing a semiconductor device package according to claim 16, wherein the cutting the resin is in a lattice shape.

* * * * *